United States Patent [19]
Tabara

[11] Patent Number: 6,080,681
[45] Date of Patent: Jun. 27, 2000

[54] METHOD OF FORMING WIRING PATTERN

[75] Inventor: Suguru Tabara, Hamamatsu, Japan

[73] Assignee: Yamaha Corporation, Japan

[21] Appl. No.: 09/234,576

[22] Filed: Jan. 21, 1999

[30] Foreign Application Priority Data

Jan. 21, 1998 [JP] Japan .................................. 10-009881

[51] Int. Cl.[7] .................................................. H01L 21/00
[52] U.S. Cl. .......................... 438/734; 438/720; 438/742; 216/67; 216/77
[58] Field of Search ................................. 438/720, 734, 438/742; 216/41, 49, 67, 77

[56] References Cited

U.S. PATENT DOCUMENTS

| | | | |
|---|---|---|---|
| 4,980,018 | 12/1990 | Mu et al. | 438/720 X |
| 5,219,485 | 6/1993 | Wang et al. | |
| 5,411,631 | 5/1995 | Hori et al. | 216/77 X |
| 5,846,443 | 12/1998 | Abraham | 216/77 |
| 6,008,132 | 12/1999 | Tabara | 438/734 |

FOREIGN PATENT DOCUMENTS 4350932 of 1992 Japan .
7-74196 of 1995 Japan .

*Primary Examiner*—William Powell
*Attorney, Agent, or Firm*—Ostrolenk, Faber, Gerb & Soffen, LLP

[57] ABSTRACT

A wiring pattern forming method includes the step of: forming resist patterns on an aluminum or aluminum alloy conductive layer, the resist patterns including a low density pattern area and a high density pattern area; etching and removing a portion of a thickness of the conductive layer by an etching process presenting anti-microloading effect by using the resist patterns as an etching mask, and etching and removing another portion of the thickness of the conductive layer by an etching process presenting microloading effect by using the resist patterns as an etching mask. A method of forming an aluminum or aluminum alloy wiring pattern is provided which can maintain a high etching rate and reduce electron shading damage.

39 Claims, 2 Drawing Sheets

METHOD OF FORMING WIRING PATTERN

This application is based on Japanese patent application HEI 10-9881 filed on Jan. 21, 1998, the whole contents of which are incorporated herein by reference.

BACKGROUND OF THE INVENTION a) Field of the Invention

The present invention relates to a wiring pattern forming method, and more particularly to a wiring pattern forming method suitable for manufacture of highly integrated semiconductor devices.

b) Description of the Related Art

Wiring patterns of a semiconductor integrated circuit or the like are formed in the following method. A conductive layer is formed on the surface of an underlying layer, a resist pattern having a desired wiring layout is formed on the conductive layer through photolithography. By using the resist pattern as an etching mask, the conductive layer is etched to form wiring patterns.

If side etching (under cut) occurs during the etching process of the conductive layer, the pattern of the conductive layer becomes different from the resist pattern so that a size precision of the final conductive pattern lowers. From this reason, anisotropic etching hard to form side etching is widely used. As anisotropic etching, reactive ion etching (RIE), magnetron RIE, and the like have been used. RIE uses etching gas which generates ions which react with metal components of a conductive layer, and remove the conductive layer.

In RIE, a voltage is applied between parallel plate electrodes, and plasma of introduced gas is generated through capacitive coupling. In magnetron RIE, a magnet is placed under a substrate to control the trajectory of ions.

In order to realize a higher integration, it is desired to form wiring patterns having a higher density. In forming wiring patterns having a higher density, it is necessary to improve a size precision of etching. In order to improve productivity, it is also desired to speed up an etching rate.

In order to speed up an etching rate, it is desired to form high density plasma. In order to improve a size precision, it is desired to lower a pressure in an etching chamber and reduce the number of collisions among molecules (ions).

To satisfy such needs, etching techniques utilizing low pressure, high density plasma have been developed. For example, if inductive coupling is used in place of capacitive coupling, plasma having a lower pressure and a higher density can be generated.

However, etching using such low pressure, high density plasma is associated with a new problem to be solved. Namely, microloading effects become conspicuous when etching using such low pressure, high density plasma is performed. The microloading effect provides a slower etching rate in a narrower etching space area than that in a broader etching space area.

If the microloading effect is large, the amounts of positive and negative charges injected into a conductive layer to be etched are not equal, and the amount of incoming positive charges becomes excessive. Depending upon the amount of accumulated charges, some charges may tunnel through a gate insulating film or the like of a MOS transistor, and the life time of the gate insulating film is shortened, depending on the accumulated amount of the tunnel current. This phenomenon is called electron shading damage which is considered to be ascribed to shading of electrons which are to be otherwise implanted via the resist pattern into a substrate surface layer. Electron shading damage is caused when the microloading effect exists and the temperature of electrons in plasma is high. If the density of high energy electrons is high, the electron shading damage becomes large.

In addition to electron shading damage, there is a phenomenon of forming notches in the lower portion of an etched conductive layer.

The reason of why electron shading damage and notches are hard to be formed in RIE heretofore performed may be ascribed to a low temperature of electrons. Even if the temperature of electrons is high, it can be expected that the electron shading damage is hard to occur, if the microloading effect does not exist. From these viewpoints, there are needs of lowering an electron temperature, lowering a density of high energy electrons, or eliminating the microloading effects.

The electron shading damage is considered to be caused by the upper side wall of an insulating mask charged with electrons. Therefore, a method has been proposed by which a conductive layer is etched by using a conductive mask which is not charged with electrons.

With this method, a three-layer structure is used. Specifically, a conductive polymer layer is coated on a conductive layer to be etched, and an inorganic mask layer is formed on the conductive polymer layer, the inorganic mask layer being a glass layer formed through spin-on, an SiN layer or an $SiO_2$ layer formed thorough sputtering, or the like. On this inorganic mask layer a resist mask pattern is formed through photolithography. First, the pattern of the resist mask is transferred to the inorganic mask layer. Then, by using the transferred pattern of the inorganic mask layer as a mask, the underlying conductive polymer layer is etched. The inorganic mask and resist mask over the conductive mask are usually removed. In this manner, the conductive mask is formed.

The number of these processes is larger than that of the processes using only a resist mask. The conductive polymer layer has a low etching selection ratio than that of an inorganic mask such as $SiO_2$ and SiN so that a thickness similar to that of a resist layer is required when the conductive polymer layer is used as a mask. Therefore, an aspect ratio of a mask pattern becomes high and the microloading effect occurs. Since the microloading effect exists even if the conductive mask is used, it is not possible to reduce the amount of over-etching of a layer under the conductive layer.

Electron shading damage is generated during an overetch, after the etching in a broader space area is finished and the conductive layer in a narrower space area is electrically separated from the semiconductor substrate. From this reason, a method has been proposed by which an over-etch is performed at a low plasma density which can lower the density of high energy electrons.

It has been reported that electron shading damage can be reduced even if an inductive coupling type plasma etcher is used, by lowering a supply power during an over-etch to lower the density of high energy electrons. However, a low plasma density during an over-etch lowers the etching rate and productivity.

In another approach to reducing electron shading damage, it is proposed to use pulse modulation plasma. By pulsating a supply power, an average power can be lowered and the electron temperature can be lowered. However, a specific apparatus is required to generate pulsated plasma.

Japanese Patent Laid-open Publication No. HEI-4-350932 proposes a method of etching a polycide electrode formed on a semiconductor substrate in two steps. The polycide electrode is a lamination of a lower polysilicon layer and an upper tungsten silicide layer.

As an etching gas of the upper tungsten silicide layer, a mixture gas of a gas selected from a group consisting of $Cl_2$, $Br_2$, HCl, and HBr and a gas selected from a group consisting of $SF_6$, $NF_3$, and $F_2$ is used. As an etching gas of the lower polysilicon layer, a gas selected from a group consisting of $Cl_2$, $Br_2$, HCl, and HBr or a mixture gas of the above-mentioned gas and a gas not containing F such as an inert gas. It is reported that this etching method suppresses side etching and improves an etching selection ratio.

Japanese Patent Laid-open Publication No. HEI-7-74156 proposes a method of plasma-etching aluminum by using a mixture gas of a chlorine-containing gas and a boron-containing gas, added with 20% or less of nitrogen gas or flon gas ($CF_4$, $CHF_3$, $C_2F_6$). By adding the nitrogen gas or flon gas, the microloading effects are suppressed, and by setting the addition amount of the nitrogen gas or flon gas to 20% or less, the etching selection ratio is maintained good.

U.S. Pat. No. 5,219,485 discloses a method of etching a silicide layer of a polycide electrode by adding 20 vol. % or less of at least one of a boron-containing gas and an oxygen gas to a mixture gas of $Cl_2$, $BCl_3$ and HCl. It is reported that this etching method can improve a pattern size precision and maintain a high etching selection ratio relative to an oxide film.

If low pressure, high density plasma is used in order to improve an etching rate, electron shading damage is generated.

SUMMARY OF THE INVENTION

It is an object of the present invention to provide a method of forming an aluminum or aluminum alloy wiring pattern capable of maintaining a high etching rate and reducing the electron shading damage.

According to one aspect of the present invention, there is provided a wiring pattern forming method comprising the steps of: forming resist patterns on a substrate having an aluminum or aluminum alloy conductive layer formed on an underlying layer, the resist patterns including a low density pattern area having a broad space between adjacent patterns and a high density pattern area having a narrow space between adjacent patterns; etching and removing a portion of a thickness of the conductive layer by an etching process presenting anti-microloading effect by using the resist patterns as an etching mask; and etching and removing another portion of the thickness of the conductive layer by an etching process presenting microloading effect by using the resist patterns as an etching mask.

A combination of the etching processes presenting the anti-microloading effect and the microloading effect can reduce a difference between an average etching rate in the low density pattern area and that in the high density pattern area. Electron shading damage can be reduced by finishing the etching process generally at the same time over the whole etching area.

As above, it is possible to alleviate the total microloading effect while the etching rate is maintained high and to reduce the electron shading damage.

DETAILED DESCRIPTION OF THE PREFERRED EMBODIMENTS

A pattern density used in this specification is defined as follows. pattern having a space area which has an aspect ratio (height/width) larger than 1 is defined as a high density pattern (narrow space), and a pattern having a space area which has an aspect ratio of 1 or smaller is defined as a low density pattern (broad space). For example, wiring patterns or the like in a memory cell area are high density patterns.

Experimental results on which the present invention is based and embodiments of the invention will be described with reference to the accompanying drawings.

It is known that anti-microloading effect occurs if a gas which generates reaction byproducts hindering etching is added to an etching gas. The anti-microloading effect lowers an etching rate in a broad space area where reaction byproducts are easy to be deposited. The etching rate in a broader space area becomes lower than that in a narrower space area.

For example, as described in the related art, it is reported that microloading effect is alleviated by adding a flon gas to a main etching gas which is a mixture of a chlorine-containing gas and a bromine-containing gas.

Figure 2A:
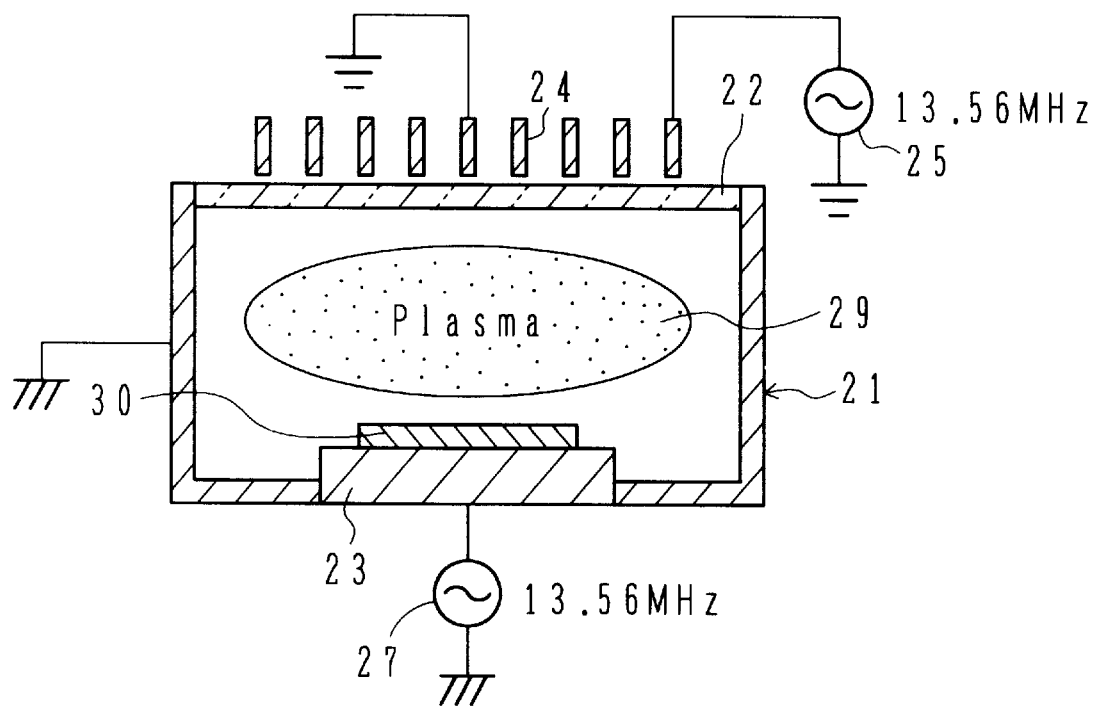
FIGS. 2A and 2B are a schematic cross sectional view of an etcher used by experiments made by the present inventor and a graph showing experimental results.

FIG. 2A is a schematic cross-sectional diagram showing the structure of an inductive coupling type plasma etcher used in experiments conducted by the inventor. In this inductive coupling type plasma etcher, a dielectric window 22 made of quartz or the like capable of transmitting electromagnetic waves is disposed at a top wall of a vacuum chamber 21 in which low pressure, high density plasma is generated. A bottom electrode 23 is mounted on the lower wall of the vacuum chamber. A gas inlet port and an exhaust port are formed through the wall of the vacuum chamber 21.

An induction coil 24 is disposed above the dielectric window 22 and is connected to a radio frequency (RF) power source 25 which supplies an RF power of, for example, 13.56 MHz. The bottom electrode 23 is connected to another RF power source 27 which supplies an RF power of, for example, 13.56 MHz.

After the inside of the vacuum chamber 21 is evacuated, an etching gas is introduced into the vacuum chamber 21 and the RF power is supplied from the induction coil 24 to the inside of the vacuum chamber 21 to generate plasma 29. A workpiece 30 such as a semiconductor wafer is placed on the bottom electrode 23 to which another RF power is supplied. Thus, a process for etching the workpiece with the plasma begins.

In the experiments to be described below, as the workpiece 30, a semiconductor wafer having an aluminum alloy (Al—Si—Cu) layer formed on an insulating layer was used. Various resist patterns were formed on the aluminum alloy layer.

For the etching presenting the microloading effect, a mixture gas of $Cl_2$ and $BCl_3$ (gas flow rates $Cl_2/BCl_3$=40/20 sccm) and a mixture gas of $Cl_2$, $BCl_3$, and $CHF_3$ (gas flow rates $Cl_2/BCl_3/CHF_3$=40/20/3 sccm) were used, and for the etching presenting the anti-microloading effect, a mixture gas of $Cl_2$, $BCl_3$, and $SF_6$ (gas flow rates $Cl_2/BCl_3/SF_6$=80/40/2 sccm) was used.

The pressure and supply powers were set common for all the etching processes as in the following:

Pressure=10 mTorr,
Top RF power RFtop=330 W, and
Bottom RF power RFbot=100 W.

The top RF power is a power supplied to the induction coil 24, and the bottom RF power is a power supplied to the bottom electrode 23.

For the etching presenting the microloading effect, line and space resist patterns having the line width fixed at 1 μm and changing the space width from 10 μm to 0.5 μm are used. For the etching presenting the anti-microloading effect, line and space resist patterns having a fixed ratio of a line width to a space width of 1:1 and changing total sum of the line width and the space width.

Figure 2B:
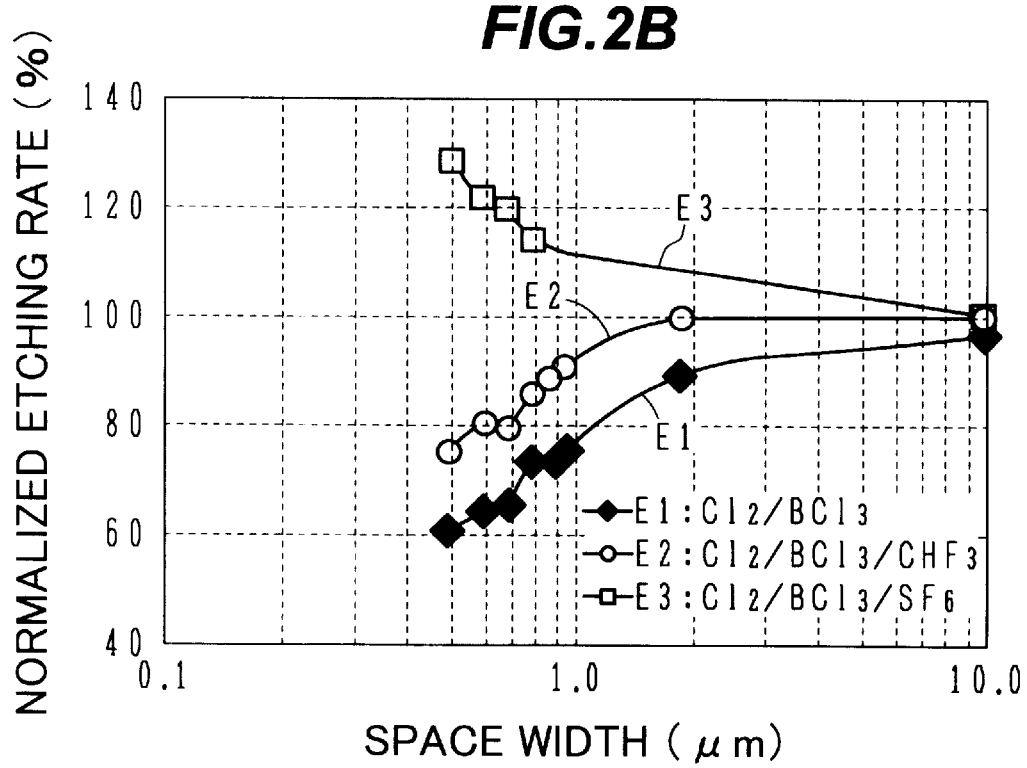

FIG. 2B shows experimented results. The abscissa represents a space width in the unit of μm and the ordinate represents a normalized etching rate. The normalized etching rate is a percentage value of an etching rate at an optional space width relative to the etching rate (100%) in an infinite space area.

A curve E1 shows an experimental result under the condition I using, as an etching gas, a mixture gas of $Cl_2$ and $BCl_3$. A curve E2 shows an experimental result under the condition II using, as an etching gas, a mixture gas of $Cl_2$, $BCl_3$, and $CHF_3$. A curve E3 shows an experimental result under the condition III using, as an etching gas, a mixture gas of $Cl_2$, $BCl_3$, and $SF_6$.

As the space width is narrowed from 10 μm, the microloading effect occurs in the case of the curve E1. The microloading effect becomes large during the etching process under the condition I using as an etching gas, a mixture gas of $Cl_2$ and $BCl_3$.

In the case of the curve E2, the etching rate hardly changes in the range of the space width of 2 μm or wider. In the narrower range of the space width, the microloading effect occurs.

Under the conditions II adding $CHF_3$ to the etching gas of the condition I, the microloading effect reduces. The reason for this may be ascribed to that addition of $CHF_3$ generates $CF_x$-based polymer which is deposited on the wafer and hinders the etching. It is presumed that this polymer deposition occurs preferentially in a wider space area so that the etching rate in the wider space area is lowered relative to the etching rate in the narrower space area. However, even if $CHF_3$ gas is added, the microloading effects cannot be completely eliminated. In the space areas narrower than 1.0 μm, the microloading effect becomes conspicuous.

The anti-microloading effect occurs in the case of the curve E3. Under the condition III adding $SF_6$ to the etching gas of the condition I, the anti-loading effect occurs so that the etching rate in the narrower space area becomes faster than the etching rate in the broader space area. The reason for this may be ascribed to that F radicals generated through dissociation of $SF_6$ fluoridize the Al surface and form $AlF_3$.

It is presumed that $AlF_3$ formation occurs preferentially in a broader space area and lowers the etching rate in the broader space area than that in a narrower space area.

It can be understood from the comparison between the conditions II and III that $AlF_3$ has a larger etching rate suppressing effect in the broader space area than $CF_x$-polymer. This may be ascribed to that $AlF_3$ is more difficult to be etched than $CF_x$-based polymer. Although Al alloy was experimentally verified, similar results can be expected in the case where Al is used.

Gas capable of fluoridizing an Al surface and forming $AlF_3$ may include $NF_3$, $BF_3$, and $PF_3$.

Under any one of the conditions I to III, the microloading and anti-microloading effects become great in a range of the space width narrower than 1.0 μm. The space width narrower than 1.0 μm will become substantially the essential conditions for manufacturing high integration semiconductor devices. Under such conditions, the microloading and anti-microloading effects become great.

Not all patterns of a semiconductor integrated circuit have the same space width. In the etching process, there are both narrow and broad space areas. If a single etching process is used, it is difficult to eliminate the microloading or anti-microloading effect so that it is difficult to prevent the electron shading damage.

However, a combination of etching processes presenting the microloading and anti-microloading effects allows a total etching process with generally a uniform etching rate independently from the space width.

An embodiment of the invention will be described with reference to FIGS. 1A to 1D.

Figure 1A:
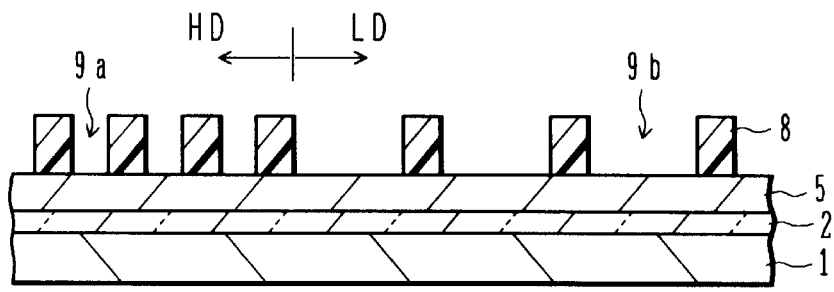
FIGS. 1A to 1D are cross sectional views of a semiconductor substrate illustrating a method of forming a wiring pattern according to an embodiment of the invention.

As shown in FIG. 1A, an aluminum or aluminum alloy conductive layer 5 is formed on an insulating film 2 such as an oxide film formed on the surface of a semiconductor substrate 1 such as a silicon substrate. Semiconductor elements such as MOS transistors are already formed on the surface of the semiconductor substrate 1.

On the conductive layer 5, a resist pattern 8 is formed having a high density pattern area HD and a low density pattern area LD. A space 9a in the high density pattern area HD has an aspect ratio higher than 1. A space 9b in the low density pattern area LD has an aspect ratio of 1 or smaller. For example, the conductive layer 5 is made of an aluminum alloy of Al—Si—Cu.

Figure 1B:
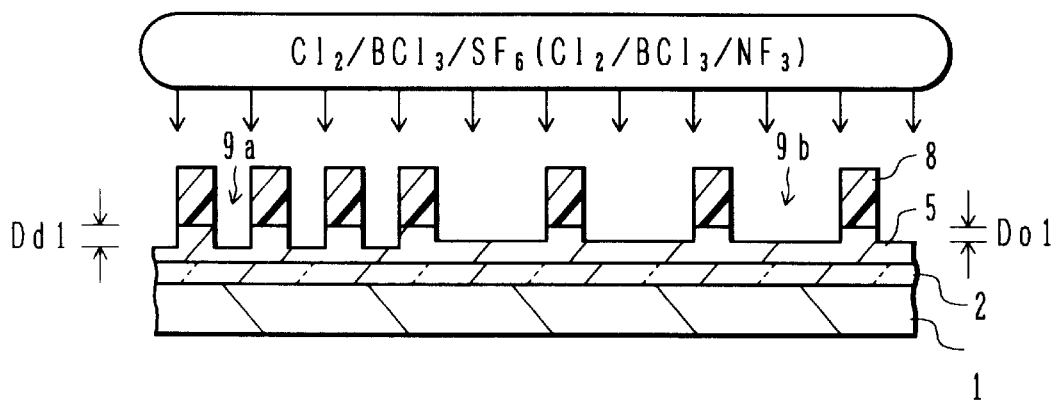

As shown in FIG. 1B, the conductive layer 5 is etched in an etcher such as shown in FIG. 2A by low pressure, high density plasma using as an etching gas a mixture gas of $Cl_2/BCl_3/SF_6$. This etching process presents the anti-microloading effect shown by the curve E3 of FIG. 2B.

The etching rate of the space 9a in the high density pattern area HD is therefore faster than that of the space 9b in the low density pattern area LD. An etching depth Dd1 of the space 9a in the high density pattern area is therefore larger than an etching depth Do1 of the space 9b in the low density pattern area, i.e., Dd1>Do1. This etching process presenting the anti-microloading effects is stopped when a partial region of the conductive layer 5 is etched.

Figure 1C:
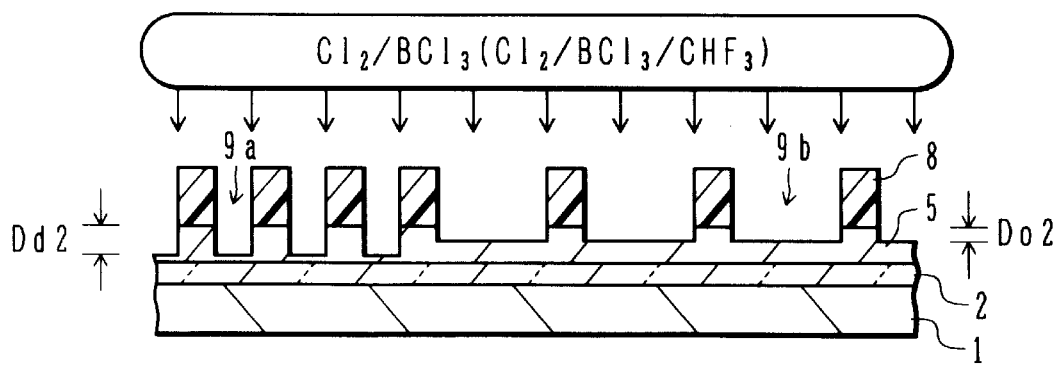

As shown in FIG. 1C, the etching gas is changed to $Cl_2/BCl_3$ and an etching process using low pressure, high density plasma is performed.

This etching process presents the microloading effect shown by the curve E1 of FIG. 2B. The etching rate of the space 9b in the low density pattern area LD is therefore faster than that of the space 9a in the high density pattern area HD.

A difference between an etching depth Dd2 of the space 9a in the high density pattern area and an etching depth Do2 of the space 9b in the low density pattern area, therefore becomes small. In other words, this can be expressed by:

Dd1/Do1>Dd2/Do2

The whole thickness of the conductive layer is etched by a combination of etching processes presenting the microloading and anti-microloading effects.

Figure 1D:
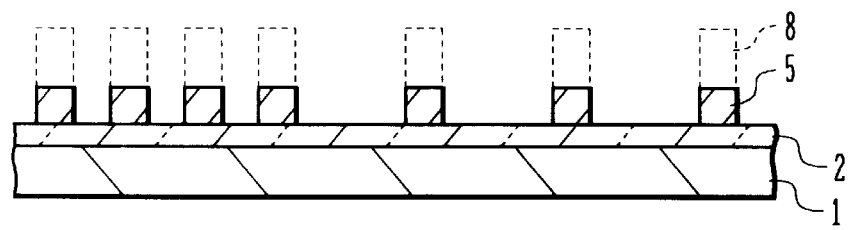

By properly selecting a ratio of the etching shown in FIG. 1B to the etching shown in FIG. 1C, the etching can be completed generally at the same time for both the high and low density pattern areas HD and LD, as shown in FIG. 1D. The etching amounts by the etching processes presenting the microloading and anti-microloading effects can be set, for example, by adjusting the etching times under the same etching conditions.

The etching gas for the etching presenting the anti-microloading effect is not limited only to $Cl_2/BCl_3/SF_6$. For example, a mixture gas of a main etching gas and one or more gases selected from a group consisting of $SF_6$, $NF_3$, $BF_3$, and $PF_3$ may be used. As the main etching gas, at least one of a chlorine-containing gas and a bromine-containing gas may be used.

Gas different from the above-described main etching gas may be used for the etching processes presenting the anti-microloading and microloading effects.

Etching gases presenting the microloading effect are widely known and may be a chlorine-containing gas, a bromine-containing gas, a mixture gas thereof, these gases added with fluorocarbon (flon gas), $N_2$, or inert gas, or the like. $C_xH_yF_z$ (x, y, z is an integer larger than 0) gas may also be added. If this gas is added in the etching process presenting the microloading effect, which is done after the etching process presenting the anti-microloading process, the $CF_x$-based polymer deposited during the etching process presenting the microloading effect can be removed by a later process of removing the resist pattern.

The chlorine-containing gas may be one or more gases selected from a group consisting of $Cl_2$, $BCl_3$, $SiCl_4$, $CCl_4$, and HCl. The bromine-containing gas may be one or more gases selected from a group consisting of $Br_2$, $BBr_3$, $SiBr_4$, $CBr_4$, and HBr.

In the above embodiment, the etching process presenting the anti-microloading effect is first executed and then the etching process presenting the microloading effect is executed. The order of the etching processes may be reversed.

The etching process presenting the anti-microloading leave reaction byproducts or residues. However, these residues can be removed. For example, residues formed by $SF_6$ can be removed by using concentrated nitric acid. Since concentrated nitric acid does not dissolve aluminum of the conductive layer, the wiring pattern is not damaged.

The embodiment has been described by taking as an example the formation of a wiring pattern of a semiconductor device. The formation of a wiring pattern is not limited only to a semiconductor device. For example, it is applicable to other electronic devices with a fine aluminum wiring pattern.

The present invention has been described in connection with the preferred embodiments. The invention is not limited only to the above embodiments. It will be apparent to those skilled in the art, that various modifications, improvements, combinations, and the like can be made.

What is claimed is:

1. A wiring pattern forming method comprising the steps of:
   (a) forming resist patterns on a substrate having an aluminum or aluminum alloy conductive layer formed on a surface of an underlying layer, the resist pattern including a first area and a second area, and a width of a space between adjacent patterns in the first area being greater than a width of a space between adjacent patterns in the second area;
   (b) etching and removing a portion of a thickness of the conductive layer by an etching process presenting anti-microloading effect by using the resist patterns as an etching mask; and
   (c) etching and removing another portion of the thickness of the conductive layer by an etching process presenting microloading effect by using the resist patterns as an etching mask.

2. A wiring pattern forming method according to claim 1, wherein said step (b) uses an etching gas containing: a chlorine-containing gas or a bromine-containing gas or a mixture gas thereof; and at least one or more fluorine-containing gases.

3. A wiring pattern forming method according to claim 2, wherein said step (b) uses an etching gas containing: at least one or more gases selected from a group consisting of $Cl_2$, $BCl_3$, $SiCl_4$, $CCl_4$, HCl, $Br_2$, $BBr_3$, $SiBr_4$, $CBr_4$, and HBr; and at least one or more gases selected from a group consisting of $SF_6$, $NF_3$, $BF_3$, and $PF_3$.

4. A wiring pattern forming method according to claim 3, wherein said step (b) uses an etching gas containing gases of $Cl_2/BCl_3/SF_6$.

5. A wiring pattern forming method according to claim 1, wherein said step (c) uses an etching gas containing a chlorine-containing gas, a bromine-containing gas, or a mixture gas thereof.

6. A wiring pattern forming method according to claim 5, wherein said step (c) uses an etching gas containing at least one or more gases selected from a group consisting of $Cl_2$, $BCl_3$, $SiCl_4$, $CCl_4$, HCl, $Br_2$, $BBr_3$, $SiBr_4$, $CBr_4$, and HBr.

7. A wiring pattern forming method according to claim 1, wherein said step (c) uses an etching gas containing: a chlorine-containing gas, a bromine-containing gas, or a mixture gas thereof, and at least one or more gases selected from a group consisting of a fluorocarbon gas, an $N_2$ gas, and an inert gas.

8. A wiring pattern forming method according to claim 6, wherein said step (c) uses an etching gas containing gases of $Cl_2/BCl_3$.

9. A wiring pattern forming method according to claim 7, wherein said step (c) uses an etching gas containing gases of $Cl_2/BCl_3/CHF_3$.

10. A wiring pattern forming method according to claim 1, wherein said steps (a), (b), and (c) are performed in this order.

11. A wiring pattern forming method according to claim 1, wherein said steps (a), (c), and (b) are performed in this order.

12. A wiring pattern forming method according to claim 11, further comprising a step of removing residues after said step (b).

13. A wiring pattern forming method according to claim 1, wherein when said steps (b) and (c) are performed, etching the conductive layer is completed generally at a same time both in the first area and in the second area.

14. A wiring pattern forming method comprising the steps of:
   (a) forming resist patterns on a substrate having an aluminum or aluminum alloy conductive layer formed on a surface of an underlying layer, the resist pattern including a first area and a second area, and a width of a space between adjacent patterns in the first area being greater than a width of a space between adjacent patterns in the second area;
   (b) etching and removing a portion of a thickness of the conductive layer by an etching process with an etching gas containing first and second gases by using the resist patterns as an etching mask, the first gas reacting with, and removing, metal components in the conductive layer during the etching process, and the second gas reacting with metal components in the conductive layer during the etching process and generating reaction byproducts hindering the etching process; and
   (c) etching and removing another portion of the thickness of the conductive layer by an etching process with an etching gas containing a third gas by using the resist patterns as an etching mask.

15. A wiring pattern forming method according to claim 14, wherein said step (b) uses the etching gas containing the first and second gases, the first gas being a chlorine-containing gas, a bromine-containing gas, or a mixture gas thereof, and the second gas being at least one or more fluorine-containing gases.

16. A wiring pattern forming method according to claim 15, wherein said step (b) uses the etching gas containing the first and second gases, the first gas being at least one or more gases selected from a group consisting of $Cl_2$, $BCl_3$, $SiCl_4$, $CCl_4$, HCl, $Br_2$, $BBr_3$, $SiBr_4$, $CBr_4$, and HBr, and the second gas being at least one or more gases selected from a group consisting of $SF_6$, $NF_3$, $BF_3$, and $PF_3$.

17. A wiring pattern forming method according to claim 16, wherein said step (b) uses the etching gas containing the first and second gases, the first gas being $Cl_2/BCl_3$, and the second being $SF_6$.

18. A wiring pattern forming method according to claim 14, wherein said step (c) uses the etching gas containing the third gas which is a chlorine-containing gas, a bromine-containing gas, or a mixture gas thereof.

19. A wiring pattern forming method according to claim 18, wherein said step (c) uses the etching gas containing the third gas which is at least one or more gases selected from a group consisting of $Cl_2$, $BCl_3$, $SiCl_4$, $CCl_4$, HCl, $Br_2$, $BBr_3$, $SiBr_4$, $CBr_4$, and HBr.

20. A wiring pattern forming method according to claim 14, wherein said step (c) uses the etching gas containing the third gas which contains: a chlorine-containing gas, a bromine-containing gas, or a mixture gas thereof; and at least one or more gases selected from a group consisting of a fluorocarbon gas, an $N_2$ gas, and an inert gas.

21. A wiring pattern forming method according to claim 19, wherein said step (c) uses the etching gas containing the third gas which contains gases of $Cl_2/BCl_3$.

22. A wiring pattern forming method according to claim 20, wherein said step (c) uses the etching gas containing the third gas which contains gases of $Cl_2/BCl_3/CHF_3$.

23. A wiring pattern forming method according to claim 14, wherein said steps (a), (b), and (c) are performed in this order.

24. A wiring pattern forming method according to claim 14, wherein said steps (a), (c), and (b) are performed in this order.

25. A wiring pattern forming method according to claim 24, further comprising a step of removing residues after said step (b).

26. A wiring pattern forming method according to claim 14, wherein when said steps (b) and (c) are performed, etching the conductive layer is completed generally at a same time both in the first area and in the second area.

27. A wiring pattern forming method comprising the steps of:
- (a) forming resist patterns on a substrate having an aluminum or aluminum alloy conductive layer formed on a surface of an underlying layer, the resist pattern including a first area and a second area, and a width of a space between adjacent patterns in the first area being greater than a width of a space between adjacent patterns in the second area;
- (b) etching and removing a portion of a thickness of the conductive layer by an etching process providing an etching rate in the second area faster than an etching rate in the first area; and
- (c) etching and removing another portion of the thickness of the conductive layer by an etching process providing an etching rate in the second area slower than an etching rate in the first area.

28. A wiring pattern forming method according to claim 27, wherein said step (b) uses an etching gas containing: a chlorine-containing gas or a bromine-containing gas or a mixture gas thereof; and at least one or more fluorine-containing gases.

29. A wiring pattern forming method according to claim 28, wherein said step (b) uses an etching gas containing: at least one or more gases selected from a group consisting of $Cl_2$, $BCl_3$, $SiCl_4$, $CCl_4$, HCl, $Br_2$, $BBr_3$, $SiBr_4$, $CBr_4$, and HBr; and at least one or more gases selected from a group consisting of $SF_6$, $NF_3$, $BF_3$, and $PF_3$.

30. A wiring pattern forming method according to claim 29, wherein said step (b) uses an etching gas containing gases of $Cl_2/BCl_3/SF_6$.

31. A wiring pattern forming method according to claim 27, wherein said step (c) uses an etching gas containing a chlorine-containing gas, a bromine-containing gas, or a mixture gas thereof.

32. A wiring pattern forming method according to claim 31, wherein said step (c) uses an etching gas containing at least one or more gases selected from a group consisting of $Cl_2$, $BCl_3$, $SiCl_4$, $CCl_4$, HCl, $Br_2$, $BBr_3$, $SiBr_4$, $CBr_4$, and HBr.

33. A wiring pattern forming method according to claim 27, wherein said step (c) uses an etching gas containing: a chlorine-containing gas, a bromine-containing gas, or a mixture gas thereof; and at least one or more gases selected from a group consisting of a fluorocarbon gas, an $N_2$ gas, and an inert gas.

34. A wiring pattern forming method according to claim 32, wherein said step (c) uses an etching gas containing gases of $Cl_2/BCl_3$.

35. A wiring pattern forming method according to claim 33, wherein said step (c) uses an etching gas containing gases of $Cl_2/BCl_3/CHF_3$.

36. A wiring pattern forming method according to claim 27, wherein said steps (a), (b), and (c) are performed in this order.

37. A wiring pattern forming method according to claim 27, wherein said steps (a), (c), and (b) are performed in this order.

38. A wiring pattern forming method according to claim 37, further comprising a step of removing residues after said step (b).

39. A wiring pattern forming method according to claim 27, wherein when said steps (b) and (c) are performed, etching the conductive layer is completed generally at a same time both in the first area and in the second area.

* * * * *